United States Patent
Wuister et al.

(10) Patent No.: US 9,625,811 B2
(45) Date of Patent: Apr. 18, 2017

(54) IMPRINT LITHOGRAPHY

(75) Inventors: Sander Frederik Wuister, Eindhoven (NL); Arie Jeffrey Den Boef, Waalre (NL); Yvonne Wendela Kruijt-Stegeman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 748 days.

(21) Appl. No.: 13/513,807

(22) PCT Filed: Oct. 1, 2010

(86) PCT No.: PCT/EP2010/064663
§ 371 (c)(1),
(2), (4) Date: Jun. 4, 2012

(87) PCT Pub. No.: WO2011/072897
PCT Pub. Date: Jun. 23, 2011

(65) Prior Publication Data
US 2012/0244319 A1    Sep. 27, 2012

Related U.S. Application Data

(60) Provisional application No. 61/287,952, filed on Dec. 18, 2009.

(51) Int. Cl.
*G03F 7/00* (2006.01)
*B82Y 10/00* (2011.01)
(Continued)

(52) U.S. Cl.
CPC ............ *G03F 7/0002* (2013.01); *B82Y 10/00* (2013.01); *B82Y 40/00* (2013.01); *G03F 9/00* (2013.01); *Y10T 428/24479* (2015.01)

(58) Field of Classification Search
CPC . B32B 3/00; B32B 3/30; G03F 7/0002; G03F 9/00; G03F 9/7042; G03F 9/7084;
(Continued)

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |

(Continued)

FOREIGN PATENT DOCUMENTS

| | | |
|---|---|---|
| CN | 101 581 889 | 11/2009 |
| JP | 2002-141279 | 5/2002 |

(Continued)

OTHER PUBLICATIONS

Japanese Office Action dated Jun. 23, 2014 in corresponding Japanese Patent Application No. 2012-543540.
(Continued)

*Primary Examiner* — Catherine A Simone
(74) *Attorney, Agent, or Firm* — Pillsbury Winthrop Shaw Pittman LLP

(57) ABSTRACT

An object provided with a particular alignment arrangement for use in aligning the object and a further object with respect to each other is disclosed. The alignment arrangement includes a first fine alignment mark in the form of a substantially regular grating, and a second coarse alignment mark located in the same area as the first alignment mark.

20 Claims, 8 Drawing Sheets

(51) Int. Cl.
*B82Y 40/00* (2011.01)
*G03F 9/00* (2006.01)

(58) Field of Classification Search
CPC ... B41F 1/18; B41F 1/34; B82Y 10/00; B82Y 40/00; H05K 1/0269; H05K 2201/09918; H05K 2203/0108; H05K 3/0008; B29C 59/02; B29C 59/022
USPC .......................................... 428/156, 167, 172
See application file for complete search history.

(56) References Cited

U.S. PATENT DOCUMENTS

| | | | |
|---|---|---|---|
| 5,917,604 A * | 6/1999 | Dirksen | G03F 9/70 257/E23.179 |
| 6,334,960 B1 | 1/2002 | Willson et al. | |
| 7,070,405 B2 | 7/2006 | Sreenivasan et al. | |
| 8,319,968 B2 | 11/2012 | Den Boef et al. | |
| 2004/0021866 A1 | 2/2004 | Watts et al. | |
| 2004/0124566 A1 | 7/2004 | Sreenivasan et al. | |
| 2005/0067379 A1 | 3/2005 | Sreenivasan et al. | |
| 2005/0274693 A1 | 12/2005 | Heidari et al. | |
| 2006/0032437 A1 | 2/2006 | McMackin et al. | |
| 2006/0266244 A1 | 11/2006 | Kruijt-Stegeman et al. | |
| 2007/0176320 A1* | 8/2007 | Nakamura et al. | 264/219 |
| 2008/0225254 A1* | 9/2008 | Komine | G03F 1/144 355/53 |
| 2010/0065987 A1 | 3/2010 | Den Boef et al. | |
| 2010/0112310 A1* | 5/2010 | Truskett | B82Y 10/00 428/195.1 |

FOREIGN PATENT DOCUMENTS

| | | |
|---|---|---|
| JP | 2006-516065 | 6/2006 |
| JP | 2006-339644 | 12/2006 |
| JP | 2007-140460 | 6/2007 |
| JP | 2008-509825 | 4/2008 |
| JP | 2008-151821 | 7/2008 |
| JP | 2008-221821 | 9/2008 |
| JP | 2010-067969 | 3/2010 |
| WO | 02/067055 | 8/2002 |
| WO | 2004/013693 | 2/2004 |

OTHER PUBLICATIONS

International Search Report mailed May 12, 2011 in corresponding International Patent Application No. PCT/EP2010/064663.
Jan Haisma et al. "Mold-assisted nanolithography: A process for reliable pattern replication," J. Vac. Sci. Technol., vol. B 14, No. 6, pp. 4124-4128 (Nov./Dec. 1996).
D.C. Hofer et al., "Coarse and Fine Alignment Using an Out of Phase Pair of Optical Grating," IP.com Journal, Dec. 1, 1980, XP013046083, ISSN: 1553-0001 (pp. 1-2).
International Preliminary Report on Patentability and Written Opinion mailed Jun. 28, 2012 in corresponding International Patent Application No. PCT/EP2010/064663.

* cited by examiner

IMPRINT LITHOGRAPHY

This application is the United States national phase entry of PCT patent application no. PCT/EP2010/064663, filed Oct. 1, 2010, which claims the benefit of United States provisional patent application no. 61/287,952, which was filed on Dec. 18, 2009, the contents of both are incorporated herein in their entireties by reference.

FIELD

The present invention relates to alignment, and in particular (although not exclusively) to alignment in imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. nanometer sized features, e.g., less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface. The recesses and protrusions define pattern features of the patterned surface of the imprint lithography template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

In order to be able to accurately apply a pattern to imprintable medium provided on a substrate, it is desirable to be able to accurately align the imprint lithography template used to imprint that pattern with a specific area or part of the substrate. This may be necessary, for example, to achieve a desired overlay specification wherein, for example, a second imprinted layer and first imprinted layer should be precisely positioned with respect to each other to be able to obtain a functioning device. For this precise positioning of different layers with respect to each other it is important to be able to (repeatedly) accurately align the imprint lithography template used to imprint that pattern with a specific area or part of the substrate. Partial or coarse alignment may take place before the imprint lithography template is contacting (i.e. is in contact with) the imprintable medium. Final and fine alignment may take place when the imprint lithography template is imprinted into the imprintable medium, and before, for example, the pattern in the imprintable medium is fixed or frozen by, for example, exposure to UV radiation. Alternatively or additionally, coarse and/or fine alignment may take place during or after the time when the imprintable medium fills recesses and flows around protrusions of the imprint lithography template. Coarse alignment may be necessary before fine alignment can be performed, because the coarse alignment may bring the imprint lithography template and substrate alignment marks into a capture range of a fine alignment system. Fine alignment may not be possible if the imprint lithography template and substrate alignment marks are not in capture range of the fine alignment system.

SUMMARY

Coarse alignment may involve aligning a box or cross (or other alignment mark) on or in the imprint lithography template with a box or cross (or other alignment mark) on or in the substrate. An example is box-in-box alignment. Fine alignment commonly involves directing radiation onto or through two spaced apart gratings, one on or in the imprint lithography template and one on or in the substrate. Diffraction of the radiation and/or the movement of fringes may be used in the alignment process. There is, however, one or more problems associated with the way in which such alignment may be undertaken.

In order to undertake coarse alignment and fine alignment, an alignment arrangement of an object will comprise two alignment marks, the first alignment mark having features for the fine alignment and separately a second alignment mark having features for the coarser alignment. An object may also comprise more than one alignment arrangement to further enhance alignment (this may for example be beneficial, because an object does not have an infinite stiffness and so alignment may need to be undertaken with or using more than one part of the object). Currently, the provision of these different alignment marks takes up too much space on the imprint lithography template and substrate. This space could otherwise be used for, for example, device pattern features (in the case of the imprint lithography template) or space for the provision of device pattern features using the imprint lithography template (in the case of the substrate). Thus, the space taken up by the first and second alignment marks may ultimately result in a reduction in throughput of patterns created on a substrate using the imprint lithography process and/or an increase of costs of any devices or other structures formed using such an imprint lithography process.

Additionally or alternatively, a problem is that processing of the imprint lithography template (for example, the formation of a mesa of the imprint lithography template) may result in a degradation or removal of opaque features of alignment marks on the imprint lithography template. Since alignment is important in ensuring the accurate application and overlay of a pattern to a substrate, the removal or degradation of such opaque features of alignment marks is problematic.

Accordingly, it is an aim of an embodiment of the invention to obviate or mitigate at least one of the disadvantages of the prior art, whether identified herein or elsewhere, or to provide an alternative to the prior art.

According to an aspect, there is provided an object provided with an alignment arrangement for use in aligning the object and a further object with respect to each other, the alignment arrangement comprising: a first fine alignment mark in the form of a substantially regular grating; and a second coarse alignment mark located in the same area as the first alignment mark.

The object may be an imprint lithography template or a substrate, and/or the further object may be a substrate or an imprint lithography template.

The second alignment mark may comprise of a gap or line which has a different width than a width of a gap or line of the substantially regular grating.

The second alignment mark may comprise of one or more selected from: a missing line in the substantially regular grating; and/or an additional line in the substantially regular grating; and/or a thicker line in the substantially regular grating; and/or a thinner line in the substantially regular grating; and/or a missing or additional diagonal line in the substantially regular grating; and/or a box in or around the substantially regular grating; and/or an increased or reduced length line or gap in the substantially regular grating.

The substantially regular grating may comprise of one or more selected from: lines and/or gaps having a pitch of the order of 1 μm-20 μm; and/or lines and/or gaps having a duty of 1:1 or another duty; and/or lines and/or gaps having a thickness of the order of 10 nm-100 nm. Such a grating may find particular use in alignment in imprint lithography.

The second alignment mark is located in the same area as the first alignment mark. Thus, the second alignment mark may be located within the substantially regular grating. Alternatively or additionally, the second alignment mark may be located immediately adjacent to the substantially regular grating.

The first alignment mark and/or second alignment mark may be or may be formed in, or formed by, or comprise, a protrusion or recess in the object.

The first alignment mark and/or second alignment mark may comprise of a material that is opaque to electromagnetic radiation that, in use, is used to align the object with the further object.

The alignment mark arrangement may be substantially the same as an alignment mark arrangement provided on the further object. This may facilitate or make easier the alignment of the object and the further object.

According to an aspect, there is provided a method of aligning an object with a further object, the object and the further object each comprising an alignment arrangement that comprises of a first fine alignment mark in the form of a substantially regular grating; and a second coarse alignment mark located in the same area as the regular grating, the method comprising: undertaking a relatively coarse alignment of the object and the further object using the second coarse alignment marks; and undertaking a relatively fine alignment of the object and the further object using the first fine alignment marks.

The coarse alignment may be undertaken using a camera or a radiation intensity measurement.

The fine alignment may be undertaken using a diffraction based technique, or using a moiré pattern based technique.

The methods described herein may have or involve one or more features of the objects described herein. As one of many examples, the object may be an imprint lithography template or a substrate, and/or the further object may be a substrate or an imprint lithography template.

According to an aspect, there is provided a method of forming a mesa of an imprint lithography template, the method comprising: providing an opaque alignment mark on the imprint lithography template using a first material; covering a part of the imprint lithography template with a second material for use in the formation of the mesa of the imprint lithography template; removing a part of the imprint lithography template not covered by the second material, a remaining part of the imprint lithography template that is covered by the second material forming a mesa; removing the second material; the first material being different to the second material, such that removal of the second material does not result in substantial removal of the first material.

The first material may comprise metal such as chromium, gold, silicon, or silicon nitride.

The second material may comprise one or more selected from: titanium, nickel, aluminium, molybdenum, gold, or silicon.

The part of the imprint lithography template that is covered by the second material may comprise a pattern for use in an imprint lithography process.

The part of the imprint lithography template that is covered by the second material may comprise the alignment mark.

Removing the second material may comprise the use of an etch process. The etch process may comprise the use of one or more selected from: a $H_2SO_4/H_2O_2$ mixture; a $NH_3/H_2O_2$ mixture; $H_2SO_4$; or $H_3PO_4$.

The alignment mark may comprise of a protrusion or recess in the imprint lithography template.

The first material may be opaque to electromagnetic radiation that is used to align the imprint lithography template with a further object, such as a substrate.

The imprint lithography template may be formed from fused silica or quartz.

According to an aspect, there is provided a mesa of an imprint template formed using the above method.

BRIEF DESCRIPTION OF THE DRAWINGS

Specific embodiments of the invention will be described with reference to the accompanying Figures, in which.

DETAILED DESCRIPTION

Figure 1A:
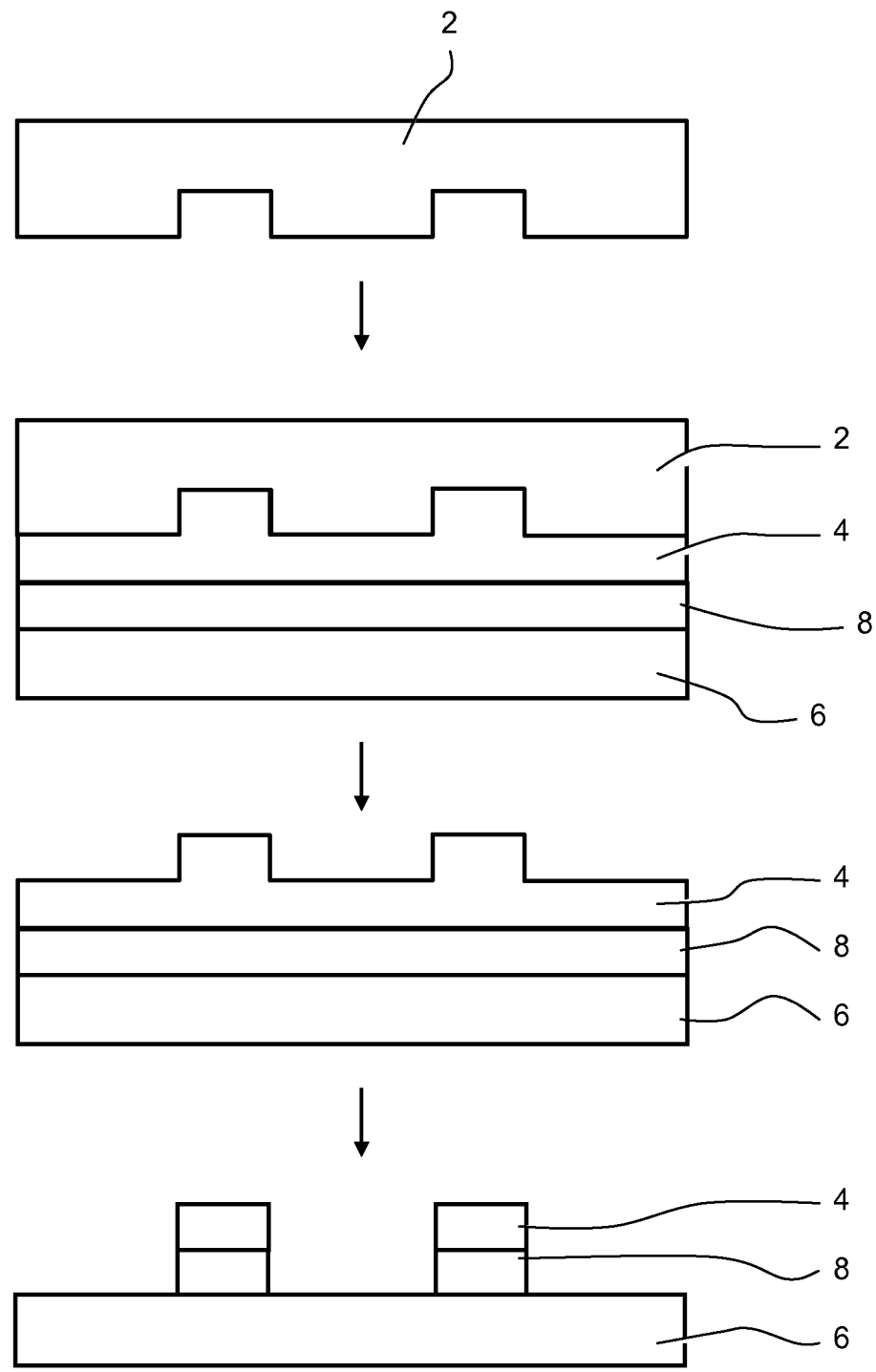
FIGS. 1a and 1b schematically depict examples of, respectively, hot imprint, and UV imprint lithography.
Figure 1B:
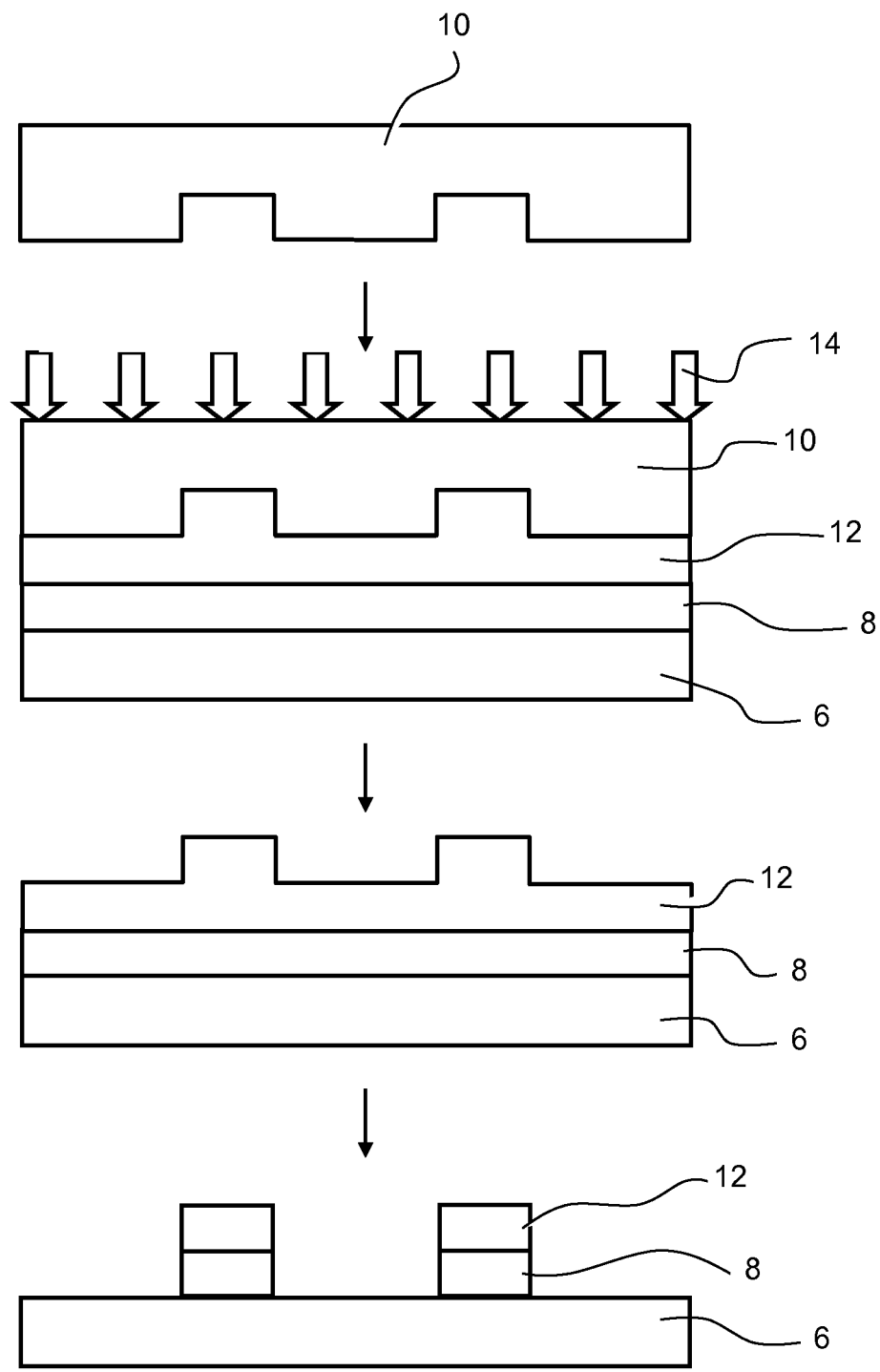

Examples of two known approaches to imprint lithography are schematically depicted in FIGS. 1a to 1b.

FIG. 1a shows an example of so-called hot imprint lithography (or hot embossing). In a typical hot imprint process, an imprint lithography template 2 is imprinted into a thermosetting or a thermoplastic imprintable medium 4, which has been provided on the surface of a substrate 6. The imprintable medium 4 may be, for example, resin. The resin 4 may for instance be spin coated and baked onto the substrate surface or, as in the example illustrated, onto a planarization and transfer layer 8 of the substrate 6. When a thermosetting polymer resin 4 is used, the resin 4 is heated to a temperature such that, upon contact with the imprint lithography template 2, the resin 4 is sufficiently flowable to flow into the pattern features defined on the imprint lithography template 2. The temperature of the resin 4 is then increased to thermally cure (crosslink) the resin 4 so that it solidifies and irreversibly adopts the desired pattern. The imprint lithography template 2 may then be removed and the patterned resin 4 cooled. In hot imprint lithography employing a layer of thermoplastic polymer resin, the thermoplastic resin is heated so that it is in a freely flowable state immediately prior to imprinting with the imprint lithography template. It may be necessary to heat thermoplastic resin to a temperature considerably above the glass transition temperature of the resin. The imprint lithography template is brought into contact with the flowable resin and then cooled to below its glass transition temperature with the imprint lithography template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1b shows an example of UV imprint lithography, which involves the use of a transparent or translucent imprint lithography template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than the thermosetting or thermoplastic resin used in hot imprint lithography and consequently may move much faster to fill imprint lithography template pattern features. A quartz template 10 is applied to a UV-curable imprintable medium 12 in a similar manner to the process of FIG. 1a. However, instead of using heat or temperature cycling as in hot imprint lithography, the pattern is frozen by curing the imprintable medium 12 with UV radiation 14 that is applied through the quartz imprint lithography template 10 onto the imprintable medium 12. After removal of the imprint lithography template 10, the imprintable medium 12 is etched (and/or undergoes other further processing) to, for example provide pattern features in the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. US Patent Application Publication 2004-0124566, U.S. Pat. No. 6,334,960, PCT Patent Application Publication WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., US Patent Application Publication 2005-0274693, which mentions a combination of heating and UV curing an imprintable medium.

Figure 2A:
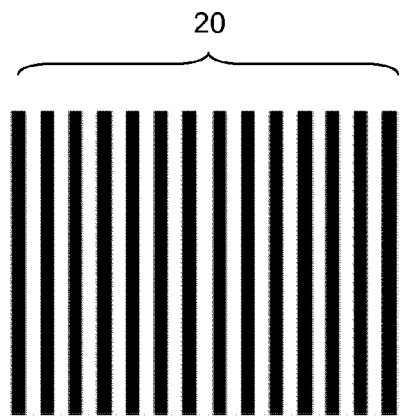
FIGS. 2a and 2b schematically depict first alignment marks provided on an imprint lithography template and a substrate, respectively.
Figure 2B:
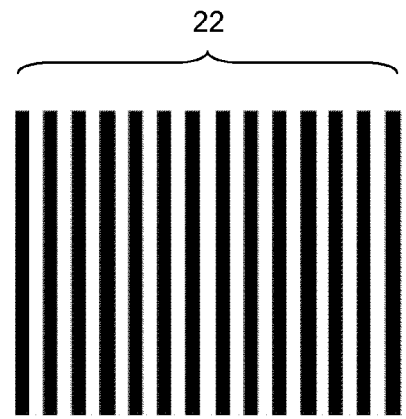

As discussed previously, it is desirable to be able to accurately align an imprint lithography template with a part or area of a substrate to help ensure that a pattern is accurately imprinted into imprintable medium provided on that substrate. Also as discussed above, there are one or more problems associated with proposed (prior art) alignment mark arrangements used in the alignment of the imprint lithography template with the one or more parts of the substrate. FIGS. 2a and 2b will be used to describe one of those problems.

FIG. 2a schematically depicts a first alignment mark 20 in the form of a regular grating. A regular grating is formed from a plurality of substantially equally spaced apart lines. The lines may be provided by the deposition of a material opaque to electromagnetic radiation that is used in an alignment process. Alternatively or additionally, the opaque material may be provided in recesses or on protrusions formed in the object to be aligned. The plurality of equally spaced apart lines may be a phase grating without any opaque material. The first alignment mark 20 in FIG. 2a may be located on a first object to be aligned relative to a further object. FIG. 2b shows that a similar or identical first alignment mark 22 (in the form of a regular grating) may be provided on that further object. The object may be an imprint lithography template or a substrate. The further object may be a substrate or an imprint lithography template. The object and further object are to be aligned relative to one another. In an embodiment the object is an imprint lithography template and the further object is a substrate, wherein the imprint lithography template and substrate are to be aligned to one another.

The first alignment marks 20, 22 in the form of regular gratings will be aligned relative to one another using a diffraction based method (e.g. involving the use of a moiré pattern or the like) as is known in the art. Such methods are used for fine alignment of, for example, the object and the further object, for instance an imprint lithography template and a substrate.

Lines or gaps in a regular grating may have pitches of the order of 1 μm-20 μm. The duty may be 1:1, but other duties are also possible. Lines or gaps of the grating may have a thickness of the order of 10 nm-100 nm.

Figure 3:
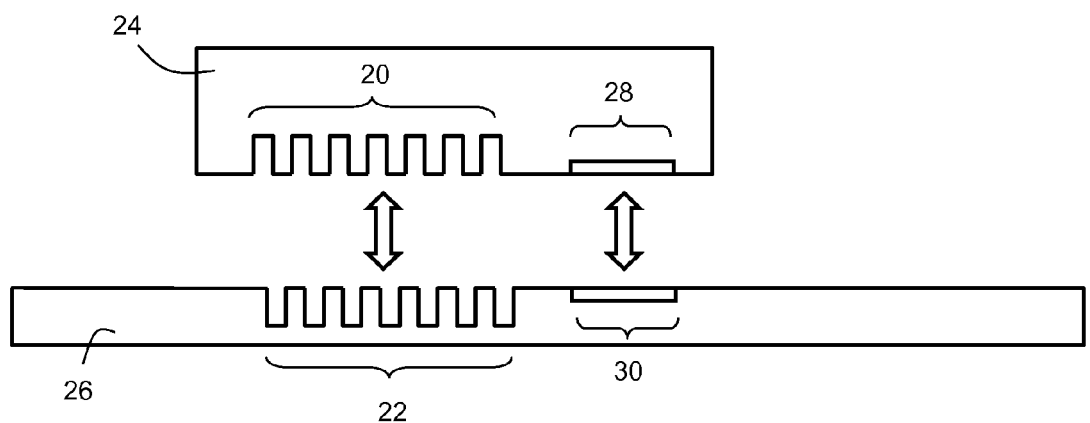
FIG. 3 schematically depicts, in a side-on view, an imprint lithography template and a substrate each provided with an alignment arrangement.

FIG. 3 schematically depicts a side-on view of an imprint lithography template 24 and a substrate 26 that are to be aligned relative to one another. The imprint lithography template is provided with the first alignment mark 20 in the form of the regular grating shown in and described with reference to FIG. 2a. The substrate 26 is provided with the same or similar first alignment mark 22 in the form of the regular grating shown in and described with reference to FIG. 2b.

Fine alignment of the substrate 26 and imprint lithography template 24 may be undertaken by appropriate alignment with or using the first alignment marks 20, 22 of the substrate 26 and imprint lithography template 24. Before such fine alignment is undertaken, a coarse alignment of the imprint lithography 24 and substrate 26 may be undertaken using second alignment marks 28, 30 which may comprise of one or more features which are coarser than those of the first alignment marks 20, 22 (e.g. have one or more larger dimensions than those of the first alignment marks 20, 22). For instance, the second alignment marks 28, 30 may be boxes or crosses, as described above. Coarse alignment of the imprint lithography template 24 and substrate 26 may be undertaken in order to bring the finer first alignment marks 20, 22 into a capture range or the like, so that fine alignment may then be undertaken.

Fine alignment marks may not be usable for coarse alignment because the signal used in the alignment of the fine alignment marks is periodic over the pitch due to the regular nature of the grating. Thus, using the fine alignment marks it is not possible to tell if you are at position x or at position x+P (pitch).

FIG. 3 shows that the first alignment marks 20, 22 and second alignment marks 28, 30 are remote from one another. The result of this is that a significant amount of space is taken up by the alignment marks themselves on both the imprint lithography template 24 and substrate 26. In the case of the imprint lithography template 24, this space could be used for further (device) pattern features, or alternatively the space could be saved by reducing the size or weight (and may be cost) of the imprint lithography template 24. Similarly, the space taken up by the alignment marks on the substrate 26 result in a loss of area on which valuable devices or other structures could be created using an imprint process, thus reducing the throughput and/or increasing a cost of each device or structure provided.

In accordance with an embodiment of the invention, one or more of the disadvantages associated with the alignment mark arrangements of FIGS. 2 and 3 may be overcome. According to an embodiment of the invention, there is provided an object (e.g. an imprint lithography template or a substrate) provided with an alignment mark arrangement for use in aligning the object with a further object (e.g. a substrate or an imprint lithography template). The alignment mark arrangement comprises a first fine alignment mark in the form of a substantially regular grating. The alignment mark arrangement further comprises a second coarse alignment mark located in the same area as the first alignment mark.

The first alignment mark may be 'substantially' regular, in that the regularity may be broken up by the presence of the second alignment mark. Without the presence of the second alignment mark, the first alignment mark could simply be a regular grating. The alignment mark arrangement as a whole could thus be described as comprising of a regular grating that includes or is adjacent to an intentional (e.g. grating) irregularity. The second alignment mark (which may be referred to as an intentional irregularity relative to the structure of the regular grating) may be one or more missing lines, one or more additional lines, one or more thicker lines, one or more thinner lines, one or more missing or additional diagonal lines, a box in or around the regular grating, an increased or reduced length line or gap in the grating, or any combination thereof. In practice any irregularity will suffice. The provision of a second alignment mark which comprises of a line or gap which has a different width to a line or gap in the substantially regular grating may be easier to provide.

Because the first and second alignment marks are located in the same area (as opposed to being remote from one another as may be the case in the prior art) the alignment mark arrangement as a whole takes up less space on the object. The second alignment mark, being located in the same area as the first alignment mark, may be located within a substantially regular grating, or be located immediately adjacent to (i.e. not remote from) the substantially regular grating.

An embodiment of the invention will now be described, by way of example only, with reference to FIGS. 4a, 4b and 5. Like features appearing in different Figures have been assigned the same reference numerals for clarity and consistency. The Figures have not been drawn to scale.

Figure 4A:
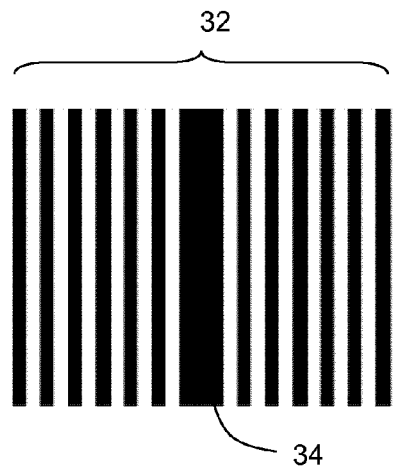
FIGS. 4a and 4b schematically depict alignment arrangements in accordance with an embodiment of the invention for use on an imprint lithography template, and a substrate, respectively.

FIG. 4a schematically depicts an alignment arrangement provided on an imprint lithography template. The alignment arrangement comprises of a first alignment mark 32 in the form of a substantially regular grating used for fine alignment. A second alignment mark 34 is located in the same area as the first alignment mark 32 in the form of the substantially regular grating, and is used for coarse alignment. In this example, the second alignment mark 34 (which may be described as an intentional irregularity) is a line which is greater in width than a width of a gap or line of the substantially regular grating of the first alignment mark 32. In another example, a second alignment mark may be or comprise a feature in the form of a gap or the like which has a greater width than the width of a gap or line of the substantially regular grating of the first alignment mark 32. As discussed above, the second alignment mark may, in other embodiments, take one of many different forms.

Figure 4B:
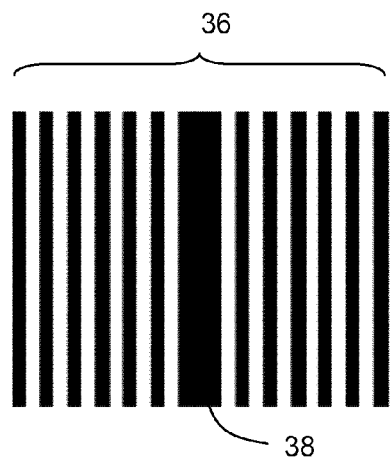

FIG. 4b schematically depicts an alignment arrangement provided on a substrate. The alignment arrangement comprises of a first alignment mark 36 in the form of a substantially regular grating used for fine alignment. A second alignment mark 38 is located in the same area as the first alignment mark 36 in the form of the substantially regular grating, and is used for coarse alignment. In this example, the second alignment mark 38 (which may be described as an intentional irregularity) is a line which is greater in width than a width of a gap or line of the substantially regular grating of the first alignment mark 36. In another example, a second alignment mark may be or comprise a feature in the form of a gap or the like which has a greater width than the width of a gap or line of the substantially regular grating of the first alignment mark 36. As discussed above, the second alignment mark may, in other embodiments, take one of many different forms.

The alignment mark arrangements of the object (e.g. imprint lithography template) and the further object (e.g. substrate) may be substantially the same, so that as well as saving space on each object, alignment may be undertaken more rapidly (e.g. because the first and second alignment marks are in the same area).

The lines of a grating may be provided by the deposition of a material opaque to electromagnetic radiation that is used in an alignment process. Alternatively or additionally, the opaque material may be provided in recesses or on protrusions formed in the object to be aligned. The plurality of equally spaced apart lines may be a phase grating without any opaque material.

Fine alignment marks (e.g. in the form of a regular grating) may not be usable for coarse alignment because the signal used in the alignment of the fine alignment marks is periodic over the pitch due to the regular nature of the grating. Thus, using the fine alignment marks it is not possible to tell if you are at position x or at position x+P (pitch). The incorporation of the second alignment mark (which may be described as an irregularity) means that a signal used in the alignment of the second coarse alignment mark is not periodic, and can thus be used to determine position.

Figure 5:
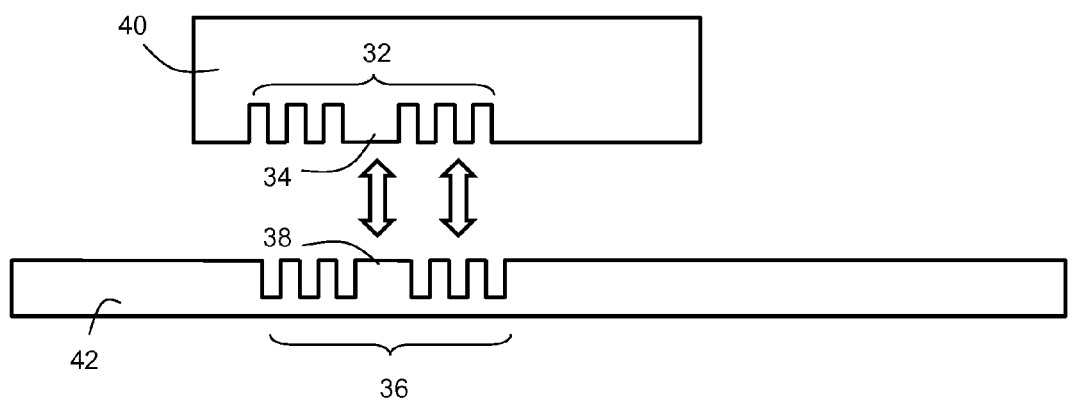
FIG. 5 schematically depicts, in a side-on view, an imprint lithography template and a substrate each provided with an alignment arrangement according to an embodiment of the invention.

FIG. 5 schematically depicts a side-on view of the imprint lithography template 40 referred to in FIG. 4*a* and the substrate 42 referred to in FIG. 4*b*. The imprint lithography template 40 and the substrate 42 may be aligned in a relatively coarse manner using the second alignment marks 34, 38 in the form of the (relatively wider) lines to bring the first fine alignment marks 32, 36 into a capture range of a fine alignment system (which may or may not be identical to an alignment system used for coarse alignment). A subsequent and relatively fine alignment of the imprint lithography template 40 and substrate 42 may be undertaken using the first alignment marks in the form of the (relatively finer) substantially regular gratings 32, 36. The coarse alignment may be undertaken using a camera or the like, or a radiation intensity measurement. The fine alignment may be undertaken using a diffraction based technique, as is known in the art.

From a comparison of FIGS. 3 and 5, it will be apparent that the alignment arrangement according to an embodiment of the invention shown in FIG. 5 takes up less space than the alignment arrangement shown in FIG. 3. The reduction in space taken up by the alignment arrangement of an embodiment of the invention may result in, for example, the provision of a smaller, lighter, or cheaper imprint lithography template. Alternatively or additionally, the reduction in space taken up by the alignment arrangement of an embodiment of the invention may result in, for example, the ability to provide more (device) patterns on a substrate and thus reduce the cost of devices or structures made using such an imprint lithography process, and/or to increase the throughput of such a process.

The first alignment mark and/or second alignment mark may be formed in, or formed by, or comprise, one or more protrusions or recesses in the object to be aligned. These recesses or protrusions may be formed using one or more etching processes or the like, as is known in the art. Alternatively or additionally the first alignment mark and/or second alignment mark may be buried in the object, for example near a surface of that object. The first alignment mark and/or second alignment mark comprises or may comprise of a material that is opaque to electromagnetic radiation that, in use, is used to align the object with the further object. The provision of the opaque material may be advantageous in that it may improve the contrast or signal-to-noise ratio of any signal used in alignment of the alignment marks of the different objects.

As discussed above, it is desirable to be able to accurately align an imprint lithography template with a substrate. To achieve this, it is desirable to ensure that the alignment marks on the imprint lithography template (for example) are not substantially degraded or removed during processing of the imprint lithography template. Such processing may, for example, involve the provision of a mesa or the like of the imprint lithography template. FIGS. 6*a* to 6*h* schematically depict a potential problem associated with the provision of a mesa of an imprint lithography template, the problem being the removal (or potential for removal) of opaque material constituting or forming alignment marks.

Figure 6A:
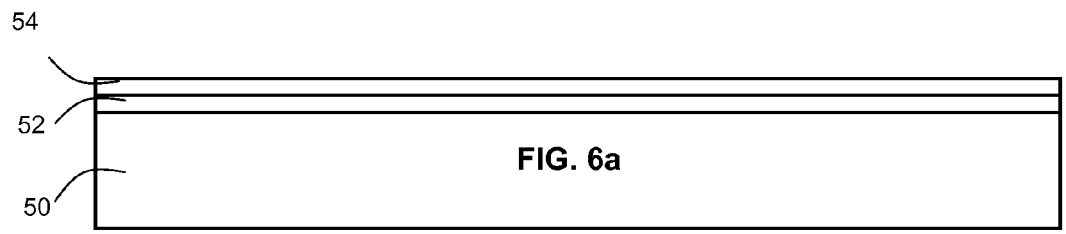
FIGS. 6a to 6h schematically depict a method for forming a mesa of an imprint lithography template.

FIG. 6*a* schematically depicts an imprint lithography template 50 in crude substrate-like form. At this stage in the method of forming a mesa of or for the imprint lithography template 50, the imprint lithography template 50 may additionally or alternatively be described as a body of material or the like (since there are, at this stage, no pattern features or the like present). The body of material, and thus the imprint lithography template 50 may be formed from, for example, fused silica or quartz. A layer of chromium 52 is provided on the imprint lithography template 50. A layer of resist 54 is provided on top of the layer of chromium 52.

Figure 6B:
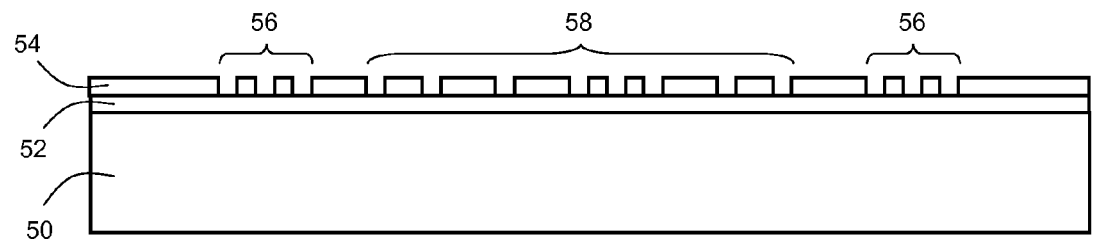

FIG. 6*b* shows that the layer of resist 54 has been patterned, for example using a standard photolithography process or the like (e.g. involving the use of a particle beam or a beam of electromagnetic radiation) or an imprint process. The patterning is designed to provide (at a later stage in the process) alignment regions 56 on the imprint lithography template 50, and a patterning region 58 on the imprint lithography template 50 to be used to imprint a pattern into imprintable medium provided on a substrate or the like.

Figure 6C:
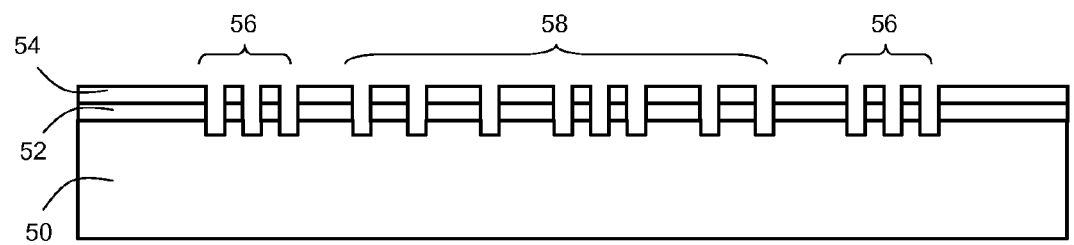

FIG. 6*c* shows that, after an appropriate etch process or the like, part of the chromium layer 52 and imprint lithography template 50 not covered by the patterned layer of resist 54 is removed (e.g. etched away) to thus form alignment region 56 and a patterned region 58 in the imprint lithography template 50.

Figure 6D:
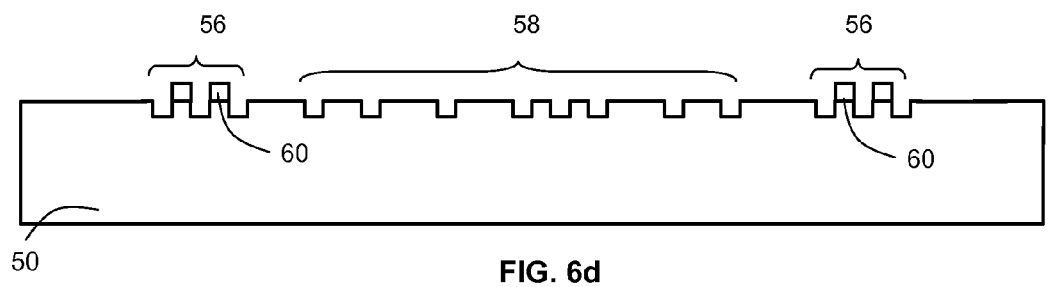

FIG. 6*d* shows that the resist and parts of the chromium layer may be removed to leave only parts of the chromium layer 60 on protrusions in the alignment regions 56. The dimensions of the remaining parts of the chromium layer 60 have been exaggerated for clarity. In another embodiment, chromium may be left (or provided) in recesses in the alignment regions 56.

The remaining parts of the chromium layer 60 are opaque to radiation used to align the imprint lithography template using the alignment regions 56, and thus improve the contrast and/or signal-to-noise ratio of a signal used in the alignment process.

Figure 6E:
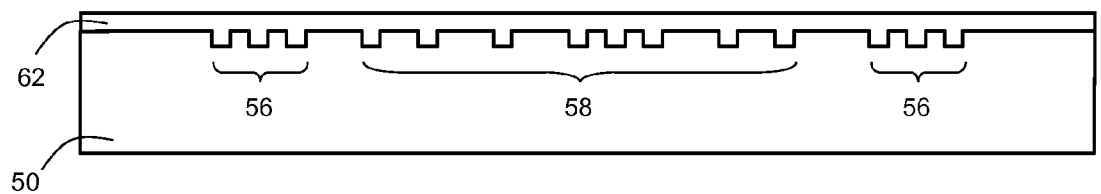

FIG. 6*e* shows that in order to form a mesa of the imprint lithography template 50 a further layer of chromium 62 is deposited on the imprint lithography template 50. The further chromium layer 62 is used to protect the pattern region 58 (and, in this embodiment, the alignment regions 56) during subsequent processing of the imprint lithography template 50.

Figure 6F:
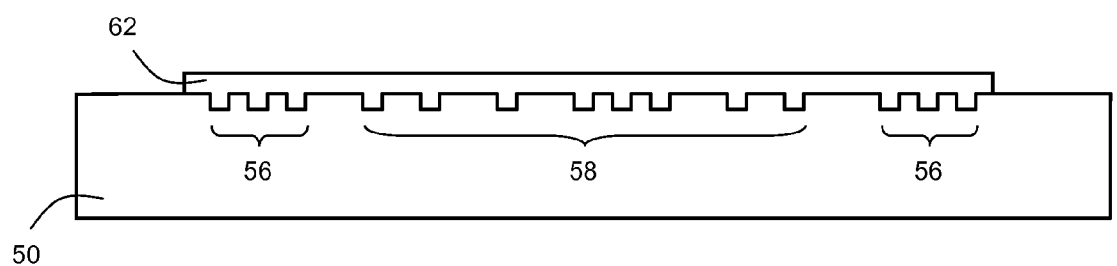

A part of the further chromium layer 62 around the periphery of the imprint lithography template 50 is removed, such that the periphery of the imprint lithography template 50 is not covered by the (protecting) further chromium layer 62. The resulting coverage of the further chromium layer 62 is shown in FIG. 6*f*.

Figure 6G:
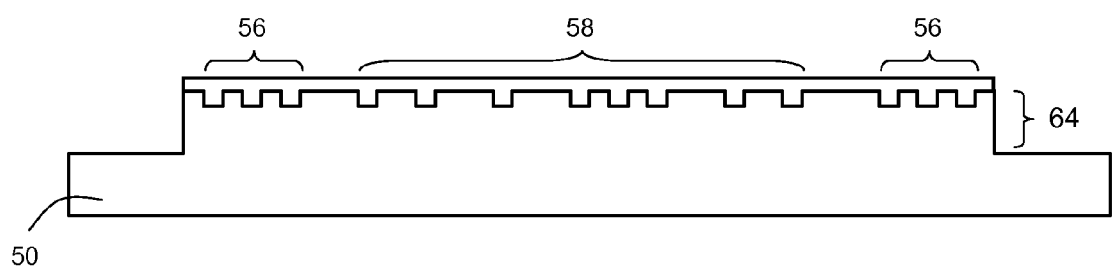

FIG. 6*g* shows that a part of the imprint lithography template 50 not covered by the further chromium layer 62 is removed (for example using an etch process or the like). A remaining part of the imprint lithography template 50 that is covered by the further chromium layer 62 forms the above-mentioned mesa 64.

Figure 6H:
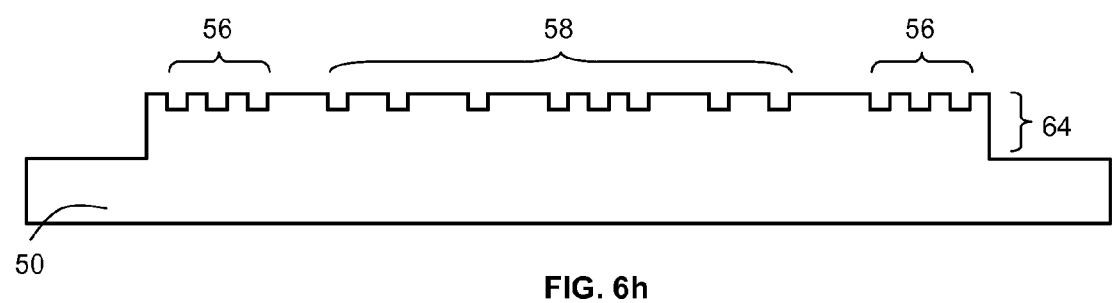

Chromium is used as the material for providing opaque areas or sections of the alignment marks, and for protecting the pattern features during processing of the imprint lithography template. This is because chromium exhibits a good adhesion to quartz and fused silica, used to form the imprint lithography template. However, because chromium is used as the opaque material for the alignment marks and also for the protective layer during processing of the imprint lithography template, removal of the further (protective) chromium layer may result in removal, or at least substantial degradation, of the chromium regions previously provided in the alignment regions of the imprint lithography template. For instance, FIG. 6*h* shows that when the further (and protective) chromium layer has been removed from the imprint lithography template 50, there is no chromium left in the alignment regions 56. This is problematic, since opaque chromium in the alignment regions would enhance the signal-to-noise ratio or contrast of any signal used to align the imprint lithography template using the alignment regions 56. Without the opaque material, alignment may not be possible.

According to an embodiment of the invention, the problems discussed above in relation to FIGS. 6a to 6h may be obviated or mitigated. According to an embodiment of the invention, there is provided a method for forming a mesa of an imprint lithography template. The method comprises providing an opaque alignment mark on the imprint lithography template using a first material. The opaque nature of the alignment mark enhances the contrast and/or signal-to-noise ratio of a signal used to align the imprint lithography template (e.g. electromagnetic radiation passing through, around or diffracting off the alignment mark). A part of the imprint lithography template (e.g. a central region, such that the periphery is not covered) is then covered with a second material for use in the formation of the mesa of the imprint lithography template. The second material may offer a degree of protection of features or the like beneath the material, during subsequent processing or the like. A part of the imprint lithography template not covered by the second material (e.g. a depth at a peripheral region) is then removed. A remaining part of the imprint lithography template that is or was not covered by the second material (e.g. a central or non-peripheral region) forms the mesa. The second material is then removed (e.g. by etching or the like). The first material is different from the second material. A difference is such that removal of the second material does not result in substantial removal of the first material. The result of this difference is that when the second material is removed, the first material, forming the opaque alignment mark, is not substantially removed and may thus be used for subsequent alignment of the imprint lithography template.

An embodiment of the invention will now be described, by way of example only, with reference to FIGS. 7a to 7e. Like features appearing in different Figures have been assigned the same reference numerals for clarity and consistency. The Figures have not been drawn to scale.

Figure 7A:
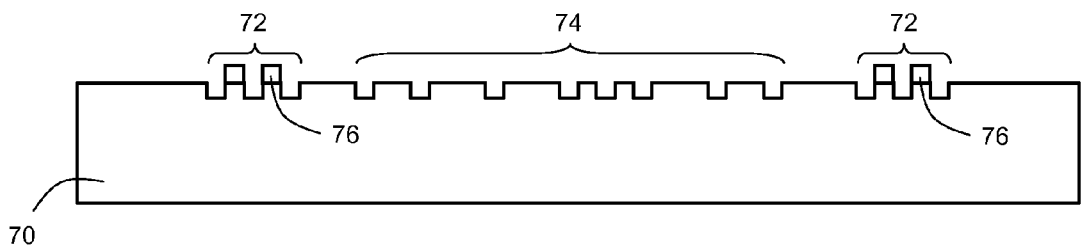
FIGS. 7a to 7e schematically depict a method for the formation of a mesa of an imprint lithography template, in accordance with an embodiment of the invention.

FIG. 7a schematically depicts an imprint lithography template 70. The imprint lithography template can be formed from fused silica or quartz or the like. The imprint lithography template comprises of alignment regions 72 for use in aligning the imprint lithography template 70, and a patterned region 74 for use in imprinting a pattern in to imprintable medium provided on, for example, a substrate or the like. In this embodiment, the alignment regions 72 and patterned region 74 comprise of protrusions and recesses in the imprint lithography template 70. The alignment regions 72 and patterned region 74 may be provided in any appropriate manner, for example in a manner similar or identical to (or different to) the manner described with reference to FIG. 6.

One or more opaque alignment marks 76 are provided on the imprint lithography template 70 in the alignment regions 72 using a first material (e.g. chromium). The opaque alignment mark 76 may be provided in substantially the same manner (or in a different manner) to that described above in relation to FIG. 6.

Chromium may be suitable for use as the material for providing opaque areas or sections of the alignment marks. This is because chromium exhibits a good adhesion to quartz and fused silica, commonly used to form the imprint lithography template 70. Other materials can also be used, as discussed below.

Figure 7B:
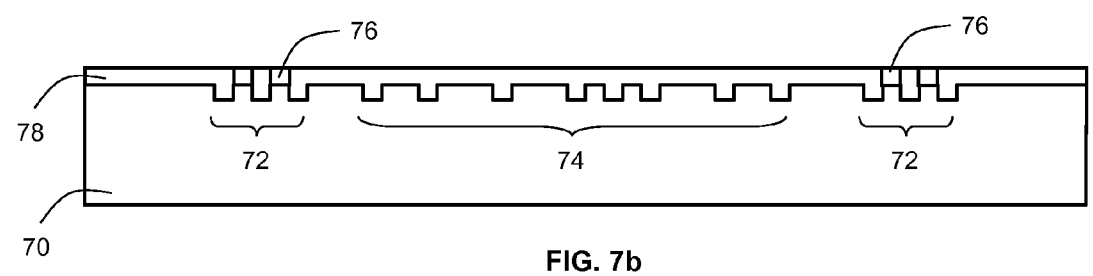

FIG. 7b shows that a part of the imprint lithography template 70 is covered with a second material 78 (e.g. in the form of a layer) for use in the subsequent formation of a mesa of the imprint lithography template 70. In FIG. 7b, the second material 78 is shown as not covering or overlaying the opaque alignment marks 76 formed from the first material 72, but in practice the second material 78 may cover or overlay the first material 76.

The first material 76 is different from the second material 78, such that a process used to remove the second material 78 will not result in substantial removal of the first material 76. For instance, the first material 76 and second material 78 may have different etch resistances to different etching compositions or fluids or the like.

The part or parts of the imprint lithography template 70 that is or are covered by the second material 78 may comprise the patterned region 74 (i.e. a pattern for use in an imprint lithography process) and/or the alignment region or regions 72 (which may be referred to as an alignment mark or the like). The second material 78 may protect the patterned region 74 and/or alignment regions 72 from damage or degradation during subsequent processing.

Figure 7C:
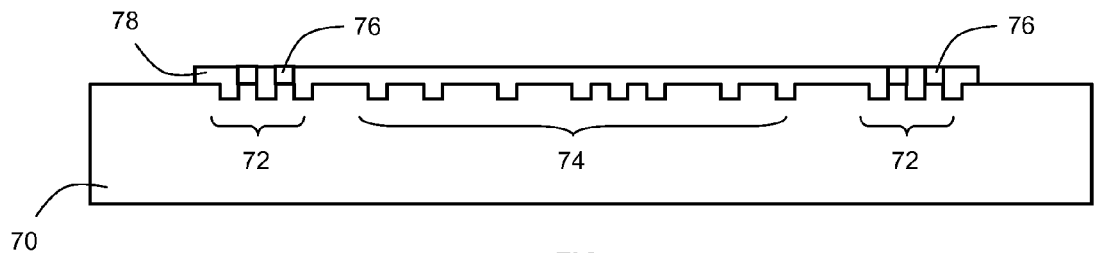

A part of second material 78 around the periphery of the imprint lithography template 70 is removed, such that the periphery of the imprint lithography template 70 is not covered by the (protective) second material 78. The resulting coverage of the second material 78 on the imprint lithography template 70 is shown in FIG. 7c.

Figure 7D:
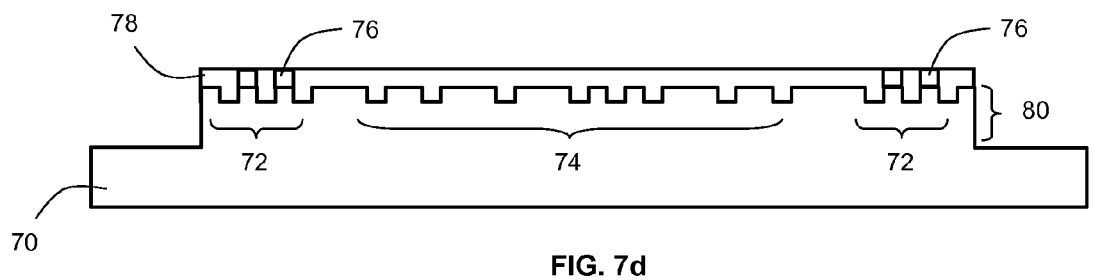

A depth of the peripheral part of the imprint lithography template 70 that is not covered by the second layer 78 is then removed, for example using an etch process or the like. The (remaining) material of the imprint lithography template 70 that was and is covered by the second material 78 forms a mesa 80 of the imprint lithography template 70. The resultant structure is shown in FIG. 7d.

Finally, the second material 78 is removed, for example, during an etch process or the like. The etch process may be specific to the type and/or nature of the second material 78, and possibly additionally specific to the type and/or nature of the first material 76 (so as not to remove that first material).

The second material may be, for example, titanium, nickel, aluminium, molybdenum, gold or silicon, all of which exhibit good adhesion to quartz and fused silica, used to form the imprint lithography template. Titanium, nickel, aluminium, molybdenum, gold or silicon also provide good support for other metal or polymer materials (e.g. subsequently applied layers, that may be required in other embodiments).

If the second material 78 is titanium, the etch process may comprise the use of a $H_2SO_4/H_2O_2$ mixture, or an $NH_3/H_2O_2$ mixture, or $H_2SO_4$. If the second material 78 is one or more of nickel, aluminium or molybdenum, the etch process may comprise the use of $H_3PO_4$. Chromium (as well as potentially other possible metals that may form alignment marks) is resistant to these chemicals and mixtures, and is thus not removed from the imprint lithography template during removal of the second material, and thus the integrity of the alignment mark comprising the opaque material (in this example, in the form of chromium) is maintained. Of course, the opaque material used to form (or at least partially form) the alignment marks may be a material other than chromium, so long as the material used is not substantially removed during the removal of the subsequently applied second material. For example, a suitable opaque material other than chromium that may be used as or for inclusion in the first alignment mark may be or comprise of other metals or the like, such as gold and silicon, or silicon nitride.

Figure 7E:
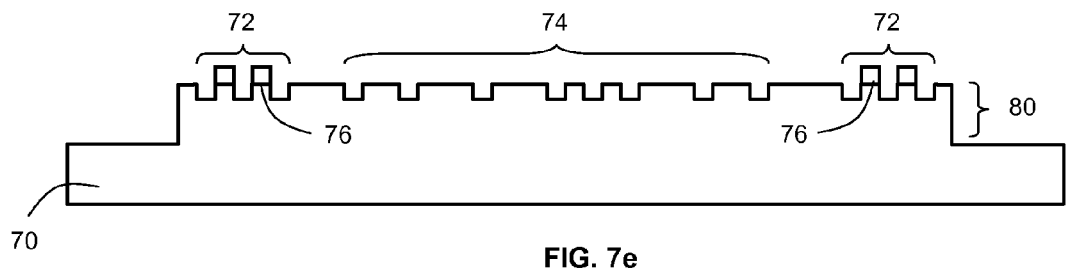

FIG. 7e shows the imprint lithography template 70 when the second layer of material 78 has been removed. It can be seen that the opaque first material 76 (in the form of chromium, in this example) remains on the substrate in the alignment regions 72. This is in stark contrast to the situation as shown in and described with reference to FIG. 6h above, where the opaque first material previously present in the alignment regions has been removed during the formation of the mesa.

As shown above in relation to FIG. 7, an alignment mark may additionally comprise one or more protrusions or recesses in the imprint lithography template. The opaque material may be provided in or on those recesses or protrusions.

The opaque material described herein is opaque to electromagnetic radiation that is used in an alignment process or method. For example, the opaque material may be opaque to radiation having a wavelength of 400 nm-900 nm that is or may be used in an alignment process or method.

The described and illustrated embodiments are to be considered as illustrative and not restrictive in character, it being understood that only embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Embodiments of the invention are provided in below numbered clauses:

1. An object provided with an alignment arrangement for use in aligning the object and a further object with respect to each other, the alignment arrangement comprising:
   a first fine alignment mark in the form of a substantially regular grating; and
   a second coarse alignment mark located in the same area as the first alignment mark.
2. The object of clause 1, wherein the object is an imprint lithography template or a substrate, and/or the further object is a substrate or an imprint lithography template.
3. The object of clause 1 or clause 2, wherein the second alignment mark may comprise of a gap or line which has a different width than a width of a gap or line of the substantially regular grating.
4. The object of clause 1 or clause 2, wherein the second alignment mark comprises of one or more selected from:
   a missing line in the substantially regular grating; and/or
   an additional line in the substantially regular grating; and/or
   a thicker line in the substantially regular grating; and/or
   a thinner line in the substantially regular grating; and/or
   a missing or additional diagonal line in the substantially regular grating; and/or
   a box in or around the substantially regular grating; and/or
   an increased or reduced length line or gap in the substantially regular grating.
5. The object of any preceding clause, wherein the substantially regular grating comprises of one or more selected from: lines and/or gaps having a pitch of the order of 1 μm -20 μm; and/or lines and/or gaps having a duty of 1:1 or another duty; and/or lines and/or gaps having a thickness of the order of 10 nm-100 nm.
6. The object of any preceding clause, wherein the second alignment mark is located within the substantially regular grating.
7. The object of any of clauses 1 to 5, wherein the second alignment mark is located immediately adjacent to the substantially regular grating.
8. The object of any preceding clause, wherein the first alignment mark and/or second alignment mark is or are formed in, or formed by, or comprise, a protrusion or recess in the object.
9. The object of any preceding clause, wherein the first alignment mark and/or second alignment mark comprises of a material that is opaque to electromagnetic radiation that, in use, is used to align the object with the further object.
10. The object of any preceding clause, wherein the alignment mark arrangement is substantially the same as an alignment mark arrangement provided on the further object.
11. A method of aligning an object with a further object, the object and the further object each comprising an alignment arrangement that comprises of a first fine alignment mark in the form of a substantially regular grating; and a second coarse alignment mark located in the same area as the regular grating, the method comprising:
    undertaking a relatively coarse alignment of the object and the further object using the second coarse alignment marks; and
    undertaking a relatively fine alignment of the object and the further object using the first fine alignment marks.
12. The method of clause 11, wherein the coarse alignment is undertaken using a camera or a radiation intensity measurement.
13. The method of clause 11 or clause 12, wherein the fine alignment is undertaken using a diffraction based technique.
14. A method of forming a mesa of an imprint lithography template, the method comprising:
    providing an opaque alignment mark on the imprint lithography template using a first material;
    covering a part of the imprint lithography template with a second material for use in the formation of the mesa of the imprint lithography template;
    removing a part of the imprint lithography template not covered by the second material, a remaining part of the imprint lithography template that is covered by the second material forming a mesa; and
    removing the second material,
    the first material being different to the second material, such that removal of the second material does not result in substantial removal of the first material.
15. The method of clause 14, wherein the first material comprises of a metal such as chromium, gold, silicon, or silicon nitride.
16. The method of clause 14 or clause 15, wherein the second material comprises one or more selected from: titanium, nickel, aluminium, molybdenum, gold, or silicon.

17. The method of any of clauses 14 to 16, wherein the part of the imprint lithography template that is covered by the second material comprises a pattern for use in an imprint lithography process.

18. The method of any of clauses 14 to 17, wherein the part of the imprint lithography template that is covered by the second material comprises the alignment mark.

19. The method of any of clauses 14 to 18, wherein the removing of the second material comprises an etch process.

20. The method of clause 19, wherein the etch process comprises the use of one or more selected from:
a $H_2SO_4/H_2O_2$ mixture;
a $NH_3/H_2O_2$ mixture;
$H_2SO_4$; or
$H_2PO_4$.

21. The method of any of clauses 14 to 20, wherein the alignment mark comprises of a protrusion or recess in the imprint lithography template.

22. The method of any of clauses 14 to 21, wherein the first material is opaque to electromagnetic radiation that is used to align the imprint lithography template with a further object, such as a substrate.

23. The method of any of clauses 14 to 22, wherein the imprint lithography template is formed from fused silica or quartz.

24. A mesa of an imprint template formed using the method of any of clauses 14 to 23.

The invention claimed is:

1. An object provided with an alignment arrangement for use in aligning the object and a further object with respect to each other, wherein the object is an imprint lithography template and the further object is a substrate, or the object is a substrate and the further object is an imprint lithography template, the alignment arrangement comprising:
a first fine alignment mark in the form of a substantially regular grating of a group of adjacent features having spaces therebetween, the periphery of the group of features defining an area within and the substantially regular grating being a diffraction grating; and
a second coarse alignment mark located at least partly within the area, the second coarse alignment mark forming an irregularity in the regular grating of the first fine alignment mark and comprising a non-space feature.

2. The object of claim 1, wherein the object is an imprint lithography template.

3. The object of claim 1, wherein the second alignment mark comprises a gap or line which has a different width than a width of a gap or line of the substantially regular grating.

4. The object of claim 1, wherein at least part of the second alignment mark forms one or more selected from:
a missing line in the substantially regular grating; and/or
an additional line in the substantially regular grating; and/or
a thicker line in the substantially regular grating; and/or
a thinner line in the substantially regular grating; and/or
a missing or additional diagonal line in the substantially regular grating; and/or
a box in or around the substantially regular grating; and/or
an increased or reduced length line or gap in the substantially regular grating.

5. The object of claim 1, wherein the substantially regular grating comprises of one or more selected from: lines and/or gaps having a pitch of the order of 1 µm-20 µm; and/or lines and/or gaps having a uniform period; and/or lines and/or gaps having a thickness of the order of 10 nm-100 nm.

6. The object of claim 1, wherein the second alignment mark is fully located within the substantially regular grating.

7. The object of claim 1, wherein the first alignment mark and/or second alignment mark is or are formed in, or formed by, or comprise, a protrusion or recess in the object.

8. The object of claim 1, wherein the first alignment mark and/or second alignment mark comprises of a material that is opaque to electromagnetic radiation that, in use, is used to align the object with the further object.

9. The object of claim 1, wherein the alignment mark arrangement is substantially the same as an alignment mark arrangement provided on the further object.

10. A method of aligning an object with a further object, wherein the object is an imprint lithography template and the further object is a substrate, or the object is a substrate and the further object is an imprint lithography template, and wherein the object and the further object each comprise an alignment arrangement that comprises of a first fine alignment mark in the form of a substantially regular grating of a group of adjacent features having spaces therebetween, the periphery of the group of features defining an area within and the substantially regular grating being a diffraction grating; and a second coarse alignment mark located at least partly within the area, the second coarse alignment mark forming an irregularity in the regular grating of the first fine alignment mark and comprising a non-space feature, the method comprising:
undertaking a relatively coarse alignment of the object and the further object using the second coarse alignment marks; and
undertaking a relatively fine alignment of the object and the further object using the first fine alignment marks.

11. The method of claim 10, wherein the coarse alignment is undertaken using a camera or a radiation intensity measurement.

12. The method of claim 10, wherein the fine alignment is undertaken using a diffraction based technique.

13. The method of claim 10, wherein the second coarse alignment mark comprises a gap or line which has a different width than a width of a gap or line of the substantially regular grating.

14. The method of claim 10, wherein at least part of the second coarse alignment mark forms one or more selected from:
a missing line in the substantially regular grating; and/or
an additional line in the substantially regular grating; and/or
a thicker line in the substantially regular grating; and/or
a thinner line in the substantially regular grating; and/or
a missing or additional diagonal line in the substantially regular grating; and/or
a box in or around the substantially regular grating; and/or
an increased or reduced length line or gap in the substantially regular grating.

15. The method of claim 10, wherein the second coarse alignment mark is fully located within the substantially regular grating.

16. The method of claim 10, wherein the second coarse alignment mark comprises a gap or line which has a different width than a width of a gap or line of the substantially regular grating.

17. The method of claim 10, wherein the substantially regular grating comprises of one or more selected from: lines and/or gaps having a pitch of the order of 1 µm-20 µm;

and/or lines and/or gaps having a uniform period; and/or lines and/or gaps having a thickness of the order of 10 nm-100 nm.

18. The method of claim 10, wherein the first alignment mark and/or second alignment mark comprises of a material that is opaque to electromagnetic radiation that, in use, is used to align the object with the further object.

19. An imprint template comprising an alignment arrangement to perform alignment between the imprint template and a substrate, the alignment arrangement comprising:
 a first alignment mark in the form of a substantially regular grating of a group of adjacent features having spaces therebetween, the periphery of the group of features defining an area within, the substantially regular grating being a diffraction grating, and the first alignment mark configured for fine alignment; and
 a second alignment mark located at least partly within the area, the second alignment mark configured for coarse alignment, forming an irregularity in the regular grating of the first fine alignment mark and not being interleaved among the features of the first fine alignment mark.

20. The imprint template of claim 19, wherein at least part of the second alignment mark forms one or more selected from:
 a missing line in the substantially regular grating; and/or
 an additional line in the substantially regular grating; and/or
 a thicker line in the substantially regular grating; and/or
 a thinner line in the substantially regular grating; and/or
 a missing or additional diagonal line in the substantially regular grating; and/or
 a box in or around the substantially regular grating; and/or
 an increased or reduced length line or gap in the substantially regular grating.

* * * * *